US012621977B2

(12) United States Patent
Sakogawa

(10) Patent No.: US 12,621,977 B2
(45) Date of Patent: May 5, 2026

(54) METHOD OF FORMING MEMORY DEVICE

(71) Applicant: Micron Technology, Inc., Boise, ID (US)

(72) Inventor: Yasuyuki Sakogawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 18/522,652

(22) Filed: Nov. 29, 2023

(65) Prior Publication Data

US 2024/0276700 A1      Aug. 15, 2024

Related U.S. Application Data

(60) Provisional application No. 63/484,272, filed on Feb. 10, 2023.

(51) Int. Cl.
H10B 12/00          (2023.01)

(52) U.S. Cl.
CPC ........... H10B 12/09 (2023.02); H10B 12/315 (2023.02); H10B 12/50 (2023.02)

(58) Field of Classification Search
CPC ....... H10B 12/09; H10B 12/315; H10B 12/50
See application file for complete search history.

(56) References Cited

U.S. PATENT DOCUMENTS

2012/0052648 A1*   3/2012   Kwon ................... H10B 12/09
                                                              257/E21.011

* cited by examiner

*Primary Examiner* — Changhyun Yi
(74) *Attorney, Agent, or Firm* — Dorsey & Whitney LLP

(57)          ABSTRACT

According to one or more embodiments of the disclosure, a method of forming a memory device including a memory region and a periphery region is provided. The method comprises: providing a first insulating layer in the memory region and the periphery region; removing a first part of the first insulating layer in the periphery region and leaving a second part of the first insulating layer in the memory region; providing a second insulating layer on the second part of the first insulating layer in the memory region, the second insulating layer and the second part of the first insulating layer forming a layer stack in the memory region; and providing at least part of a gate stack in the periphery region, the gate stack including an overlapping part over the layer stack in the memory region, the overlapping part in a boundary region between the memory region and the periphery region.

20 Claims, 11 Drawing Sheets

METHOD OF FORMING MEMORY DEVICE

CROSS REFERENCE TO RELATED APPLICATION(S)

This application claims priority to U.S. Provisional Application No. 63/484,272, filed Feb. 10, 2023. The aforementioned application is incorporated herein by reference, in its entirety, for any purpose.

BACKGROUND

A memory device may include memory regions and periphery regions. The memory regions include memory banks of memory cells that are accessed for data read and write. The periphery regions are provided adjacent to the memory regions and include various circuits for memory operations.

Certain multiple processes are performed to form memory regions and peripheral regions on a semiconductor substrate or a semiconductor wafer. During the processes, a particular care is taken to a boundary between adjacent memory and periphery regions.

DETAILED DESCRIPTION

Figure 1:
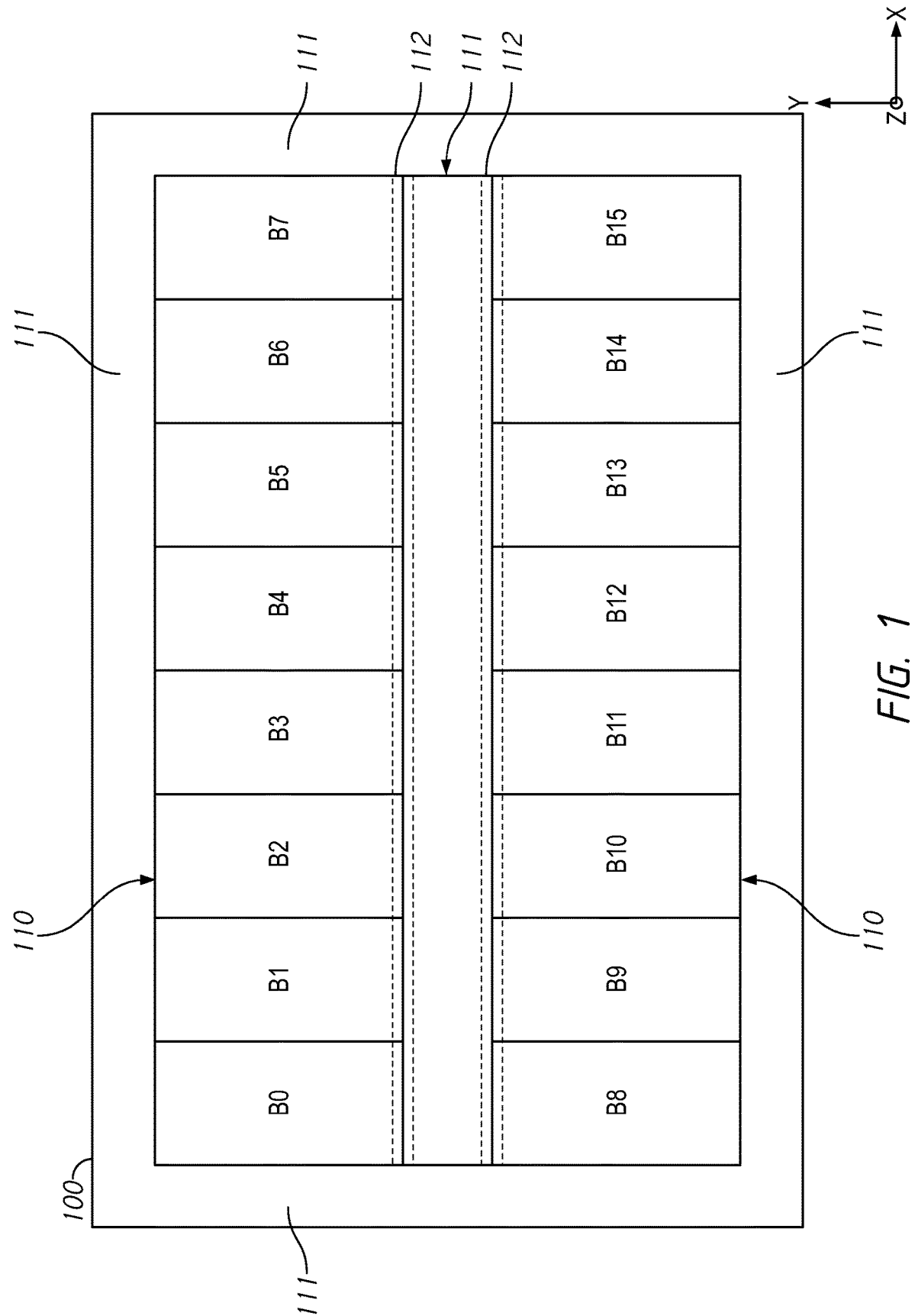
FIG. 1 depicts a block diagram of a memory device including a memory region and a periphery region in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, the dimensions and dimensional ratios of each unit do not necessarily match the actual dimensions and dimensional ratios in the embodiments.

FIG. 1 depicts an example of a block diagram of a memory device 100 in a plan view according to an embodiment of the disclosure. The memory device 100 may be one example of a semiconductor device. The memory device 100 may be one example of an apparatus. The memory device 100 includes one or more memory regions (may also be referred to as cell regions) 110 and one or more periphery regions (may also be referred as peripheral regions) 111. The memory regions 110 include a plurality of memory banks of memory cells. In the example, the memory device 100 includes a pair of the memory regions 110 arranged in two rows that are extending in one direction (for example, X-direction in the drawing) and neighboring with each other in another direction (for example, Y-direction perpendicular to X-direction in the drawing). The memory regions 110 of the pair include, respectively, a first group of memory banks BANK0-BANK7 (B0-B7) and a second group of memory banks BANK8-BANK15 (B8-B15). The memory banks in each group are arranged next to each other in the corresponding row. The memory banks may be accessed to read data from and write data to the memory cells. In the example, one periphery region 111 is provided between the memory regions 110. The periphery region 111 is adjacent to the memory regions 110 with boundaries or boundary regions 112 therebetween. Regions around the memory regions 110 may also be the periphery regions 111 including boundaries or boundary regions with the neighboring memory regions 110. Various circuits and circuit elements (for example, transistors) that are used for memory operations are included in the periphery regions 111. Such circuits and circuit elements in the periphery regions 111 are electrically connected to or electrically coupled to the memory cells in the memory regions 110 via, for example, conductive wirings or wiring layers, and conductive contacts. The number, the position, the arrangement and such of the memory regions 110 are not limited to the examples and the embodiments described herein. The number, the position, the arrangement and such of the memory banks and/or the memory cells are not limited to the examples and the embodiments described herein. The number, the position, the arrangement and such of the periphery regions 110 are not limited to the examples and the embodiments described herein.

The memory regions 110 and the periphery regions 111 are formed on a semiconductor substrate or a semiconductor wafer (not separately depicted) by multiple processes of a plurality of layers.

FIGS. 2-9 depict an example of processes of forming at least part of a memory device 200 including a memory region 200A and a periphery region 200B in a cross-sectional view according to an embodiment of the disclosure. The memory device 200 may be part of the memory device 100 of FIG. 1, and the memory region 200A and the periphery region 200B may be one of the memory regions 110 and one of the periphery regions 111, respectively. The memory region 200A and the periphery region 200B are provided adjacent to or neighboring each other on a semiconductor substrate (or a semiconductor wafer) 201.

The semiconductor substrate 201 may include silicon. The semiconductor substrate 201 may include at least part of a transistor structure including a channel region 203 and source and drain regions (not separately depicted). The source region (or source) and the drain region (or drain) may be formed in an n-well of a p-type semiconductor substrate or a p-well of an n-type semiconductor substrate. A gate region (or a gate) of the transistor structure is provided at least over the channel region 203. After the gate region is formed, remaining portions of the channel region 203 may form the source and drain regions. The semiconductor substrate 201 also includes a trench or a trench isolation 202, such as a shallow trench isolation, to isolate the neighboring transistors from each other. The trench 202 includes an insulating material, such as silicon dioxide (SiO$_2$). The transistor structure may include an n-channel metal-oxide-semiconductor (NMOS) transistor and/or a p-channel metal-oxide-semiconductor (PMOS) transistor. The transistor structure may include a plurality of transistor structures. The source region and the drain regions may include a plurality of source regions and a plurality of drain regions, respectively. The channel region may include a plurality of channel regions. The gate region may include a plurality of gate regions. The number and the arrangement of the transistor structure as well as those of the corresponding regions are not limited to the examples and the embodiments described herein. The transistor structure may be formed by conventional methods using conventional materials.

Further provided in the memory region 200A are a plurality of word lines 204 arranged next to each other in one horizontal direction (that is a first horizontal direction or X direction in the drawing) and running in another horizontal direction (that is a second horizontal direction or Y direction in the drawing) perpendicular to the first horizontal direction in the drawing. The word lines may be sub-word lines in an edge region of each of memory blocks. The sub-word lines may be coupled to one or more memory cells. Each word line may include, for example, a metal film, a polysilicon (Poly-Si) film, and an insulating film formed on one another in that order from the bottom. The metal film may include a conductive metal or metallic material, such as tungsten (W) and titanium nitride (TiN). The insulating film may include an insulating material, such as nitride. There may also be a plurality of bit lines or digit lines (not separately depicted) in the memory region 200A. Memory cells may be located at intersections of word lines (row) and bit/digit lines (columns). There may also be a plurality of conductive contacts in the memory region 200A.

Figure 2:
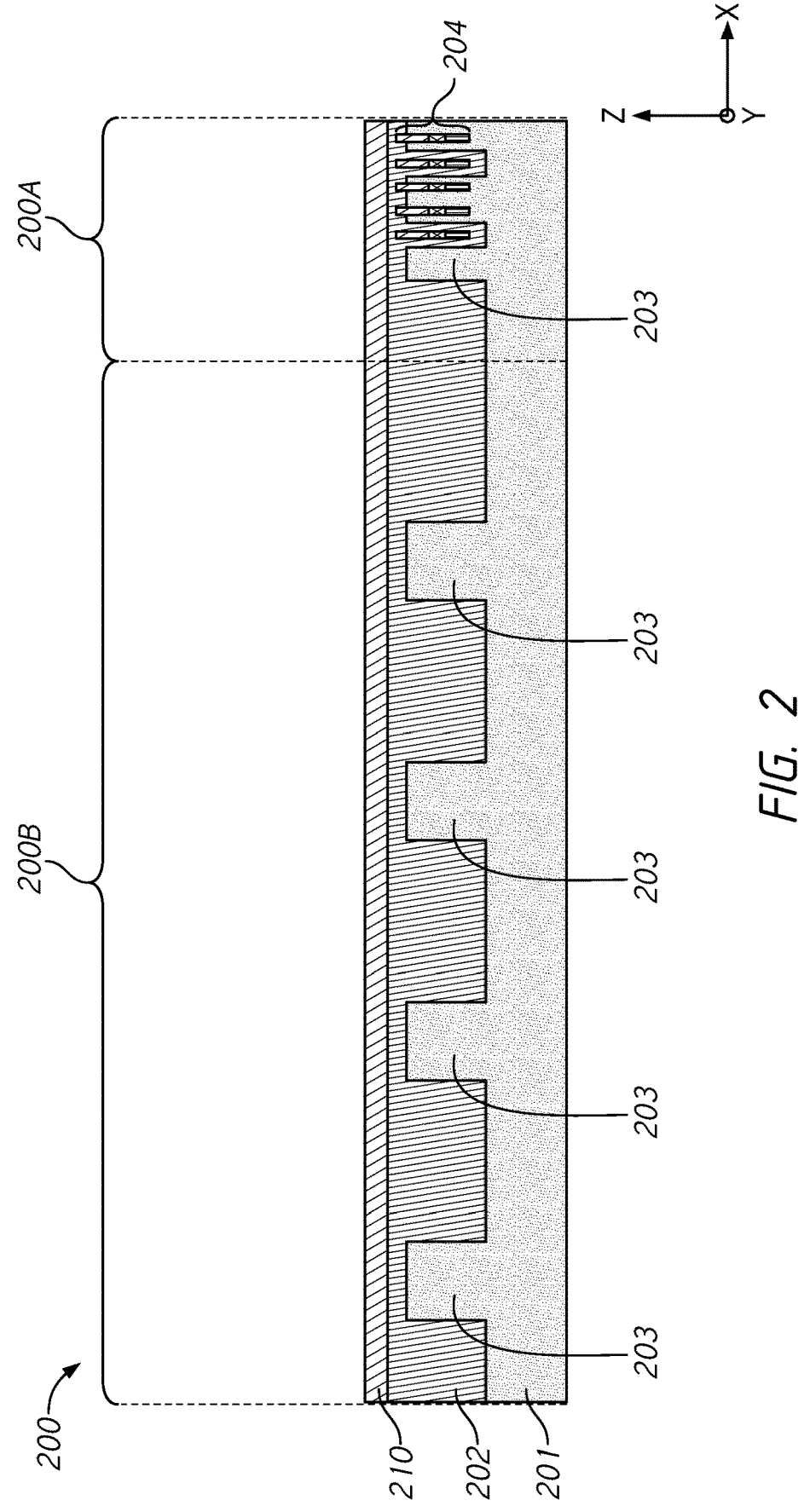
FIG. 2 depicts a process of forming at least part of a memory device including a memory region and a periphery region in a cross-sectional view according to an embodiment of the disclosure.

As shown in FIG. 2, an insulating layer 210 is provided on an upper surface of the semiconductor substrate 201. The insulating layer 210 may be a dielectric layer. The insulating layer 210 may include an insulating film. The insulating layer 210 may include an insulating material, such as nitride. The insulating layer 210 may have a thickness relatively thick. For example, a conventional insulating layer, such as a nitride layer or a nitride film, may have provided thereon an oxide layer or an oxide film which is used as a mask at the time of formation of a peripheral gate oxide film to protect the conventional insulating layer from oxidation. On the other hand, the insulating layer 210 according to the present embodiment may not have such an oxide layer or an oxide layer in the periphery region 200B. Hence, the insulating layer 210 may be formed to have the thickness greater than that of the conventional insulating layer. The thickness of the insulating layer 210 may be substantially the same as the total thickness of the conventional insulting layer and the oxide layer deposited thereon. The insulating layer 210 may be formed by conventional deposition methods.

Figure 3:
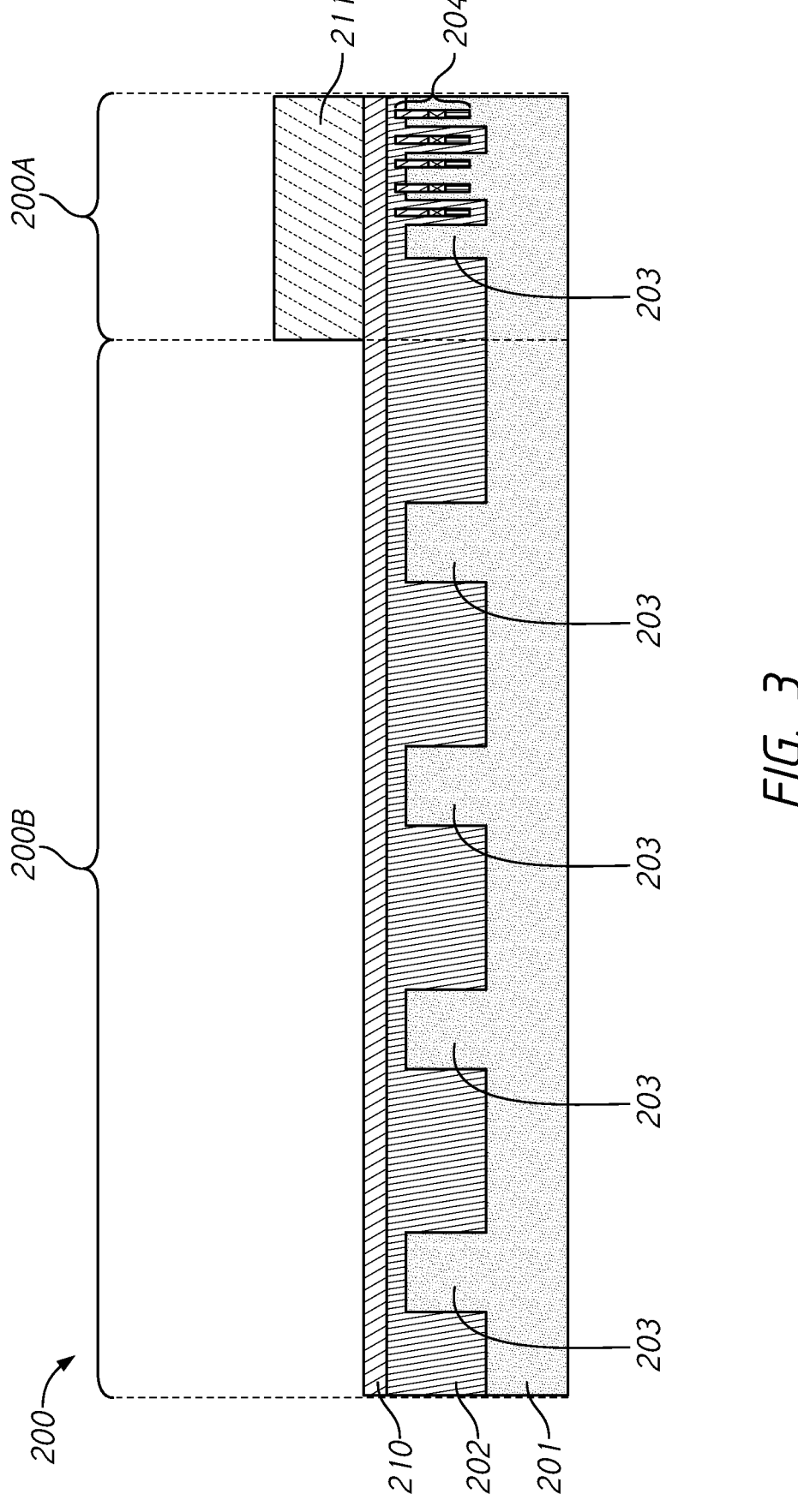
FIG. 3 depicts a process of forming at least part of a memory device including a memory region and a periphery region in a cross-sectional view according to an embodiment of the disclosure.

As shown in FIG. 3, a mask layer 211 is provided on the insulating layer 210 in the memory region 200A, and a photo process is applied to the periphery region 200B and the memory region 200A. The photo process may be performed by conventional photo methods, such as photolithography techniques. Because of this process, a separate provision or deposition process of an insulating layer, such as an oxide layer or an oxide film, in the periphery region 200B, can be eliminated, unlike the conventional insulating layer which requires the oxide layer or film as the mask for the peripheral gate oxide film formation.

Figure 4:
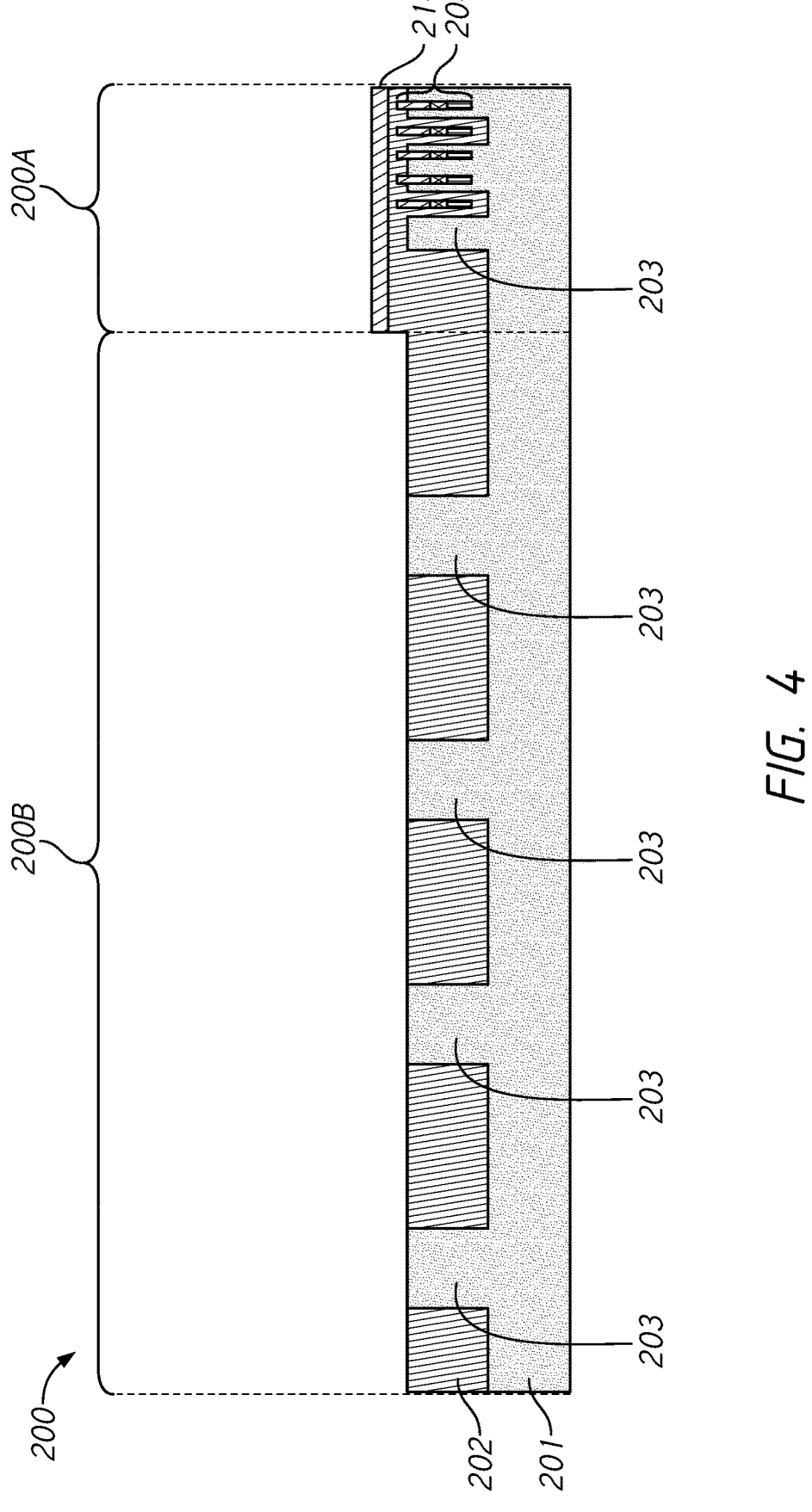
FIG. 4 depicts a process of forming at least part of a memory device including a memory region and a periphery region in a cross-sectional view according to an embodiment of the disclosure.

As shown in FIG. 4, the mask layer 211 in the memory region 200A and an upper part of the periphery region 200B including at least part of the insulating layer 210 are removed by, for example, etching. The etching may be dry etching and/or wet etching. Both dry etching and wet etching may be separately performed to remove the corresponding parts in the periphery region 200B and the memory region 200A as appropriate. The etching may be performed by conventional etching techniques. By this process, the insulating layer 210 remains only in the memory region 200A, and an upper surface of the periphery region 200B is exposed and lower in depth or height in a vertical direction (or Z-direction in the drawing) than that of the memory region 200A. The cross-sectional view of FIG. 4 shows a step structure at a boundary between the periphery region 200B and the memory region 200A. The remaining part of the insulating layer 210 in the memory region 200A insulates the semiconductor substrate 201 and the structure on the semiconductor substrate 201 including, for example, word lines and bit lines in the memory region 200A.

Figure 5:
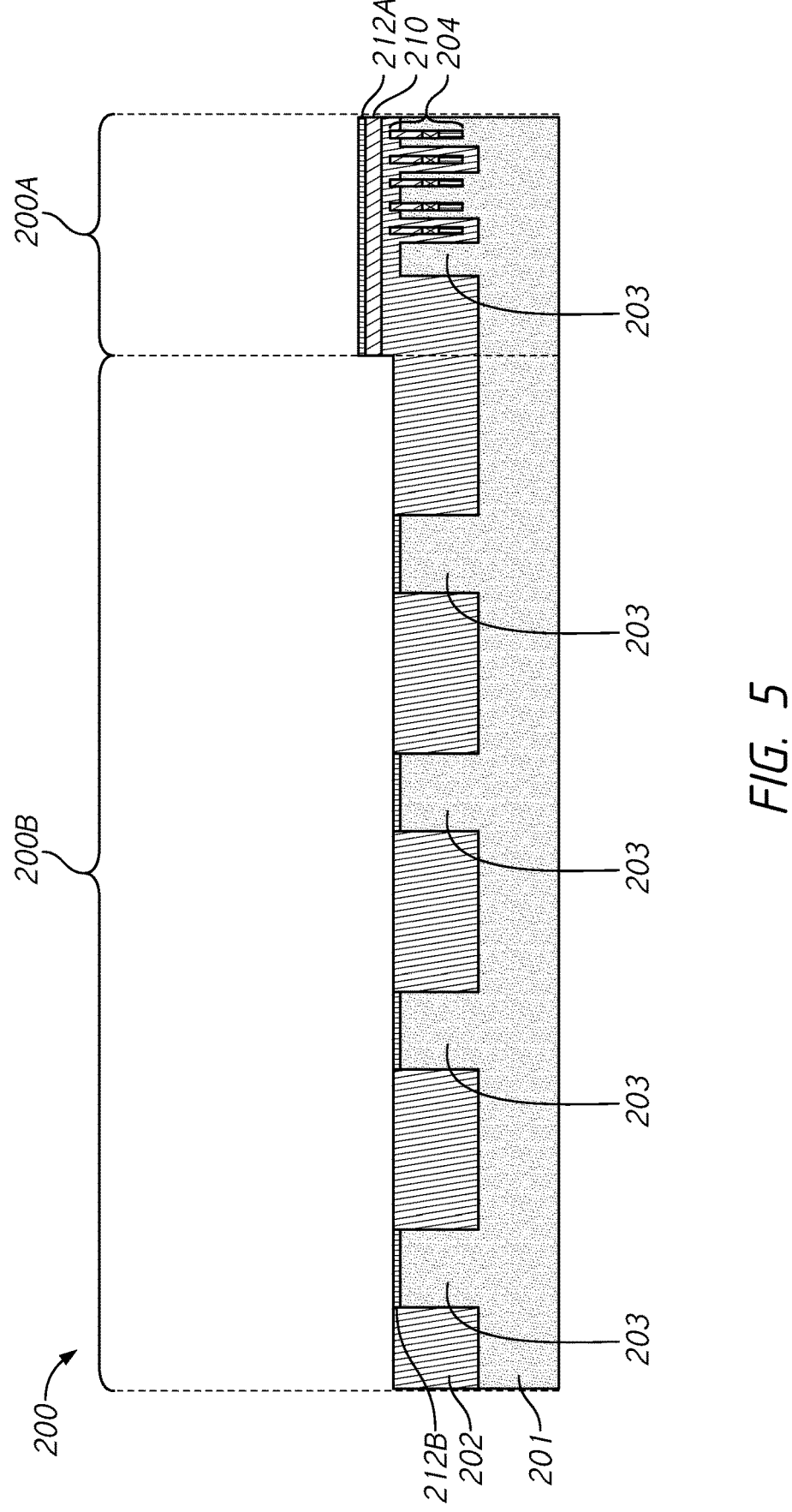
FIG. 5 depicts a process of forming at least part of a memory device including a memory region and a periphery region in a cross-sectional view according to an embodiment of the disclosure.

As shown in FIG. 5, insulating layers 212A and 212B are provided on an upper surface of the insulating film 210 in the memory region 200A and on an upper surface of each of the channel regions 203 in the periphery region 200B, respectively. The insulating layers 212A and 212B may be dielectric layers. The insulating layers 212A and 212B may include insulating films. The insulating layers 212A and 212B may include an insulating material, such as oxide. The insulating layers 212A and 212B may be formed by conventional oxidation methods. The insulating layers 212A and 212B may be formed at the same time by performing oxidation to both the memory region 200A and the periphery region 200B. This oxidation may also be referred to as gate oxidation. The insulating layer 212B in the periphery region 200B may provide an oxide film. The insulating layer 212A in the memory region 200A may provide an oxidized nitride film in the case where the insulating layer 210, which is the underlying layer, includes nitride. The insulating layer 212A and the insulating layer 210 form a layer stack over the semiconductor substrate 201 in the memory region 200A. Because of the oxidation process, at least an upper part of the insulating layer 210, such as the nitride film, is oxidized to provide the insulating layer 212A, such as the oxidized nitride film, and hence, a separate process of adding a mask layer or film can be eliminated, making the entire process further efficient. The insulating layers 212A and 212B are used as etch stop layers or mask layers in the later processes.

Figure 6:
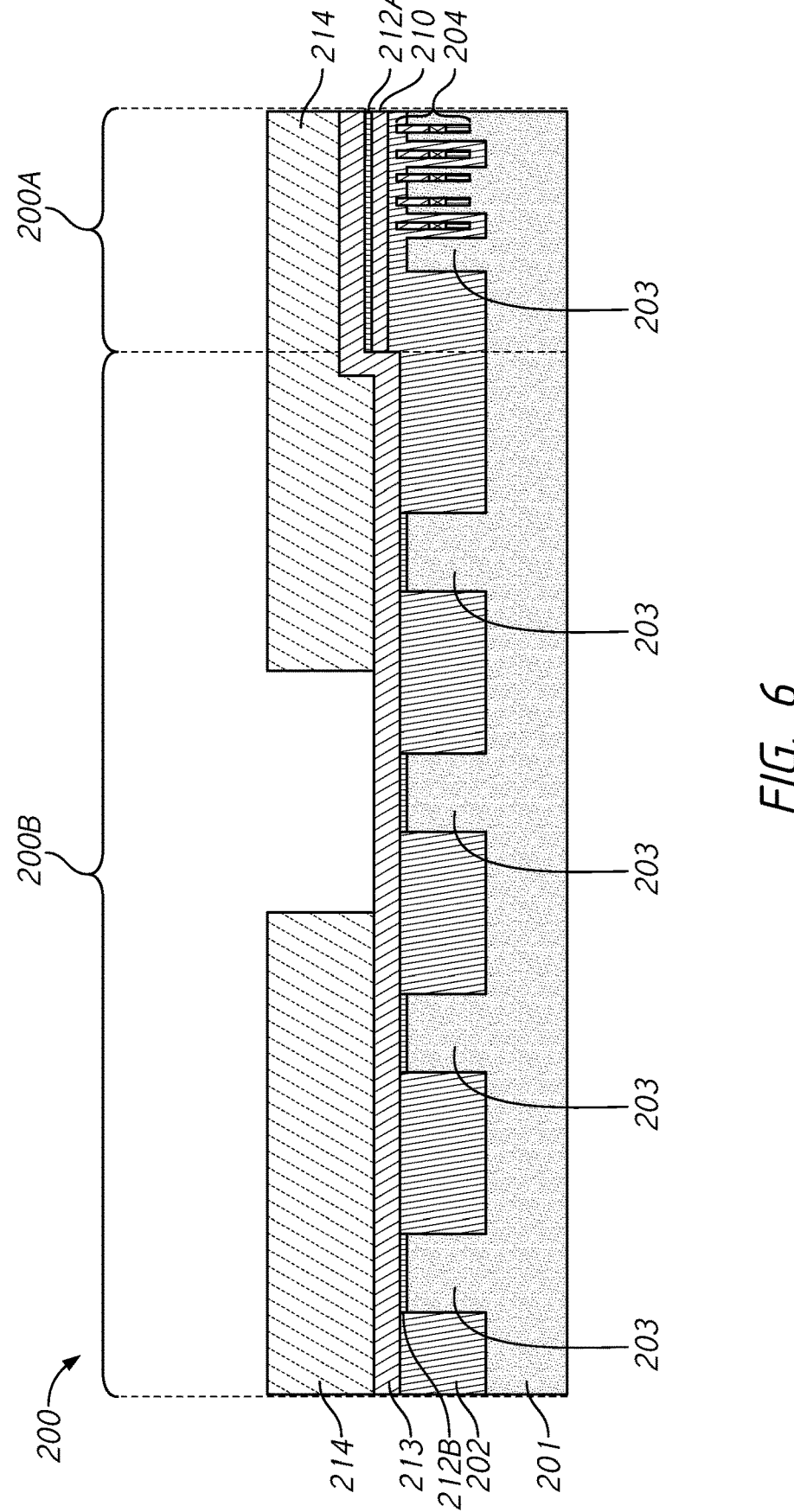
FIG. 6 depicts a process of forming at least part of a memory device including a memory region and a periphery region in a cross-sectional view according to an embodiment of the disclosure.
Figure 7:
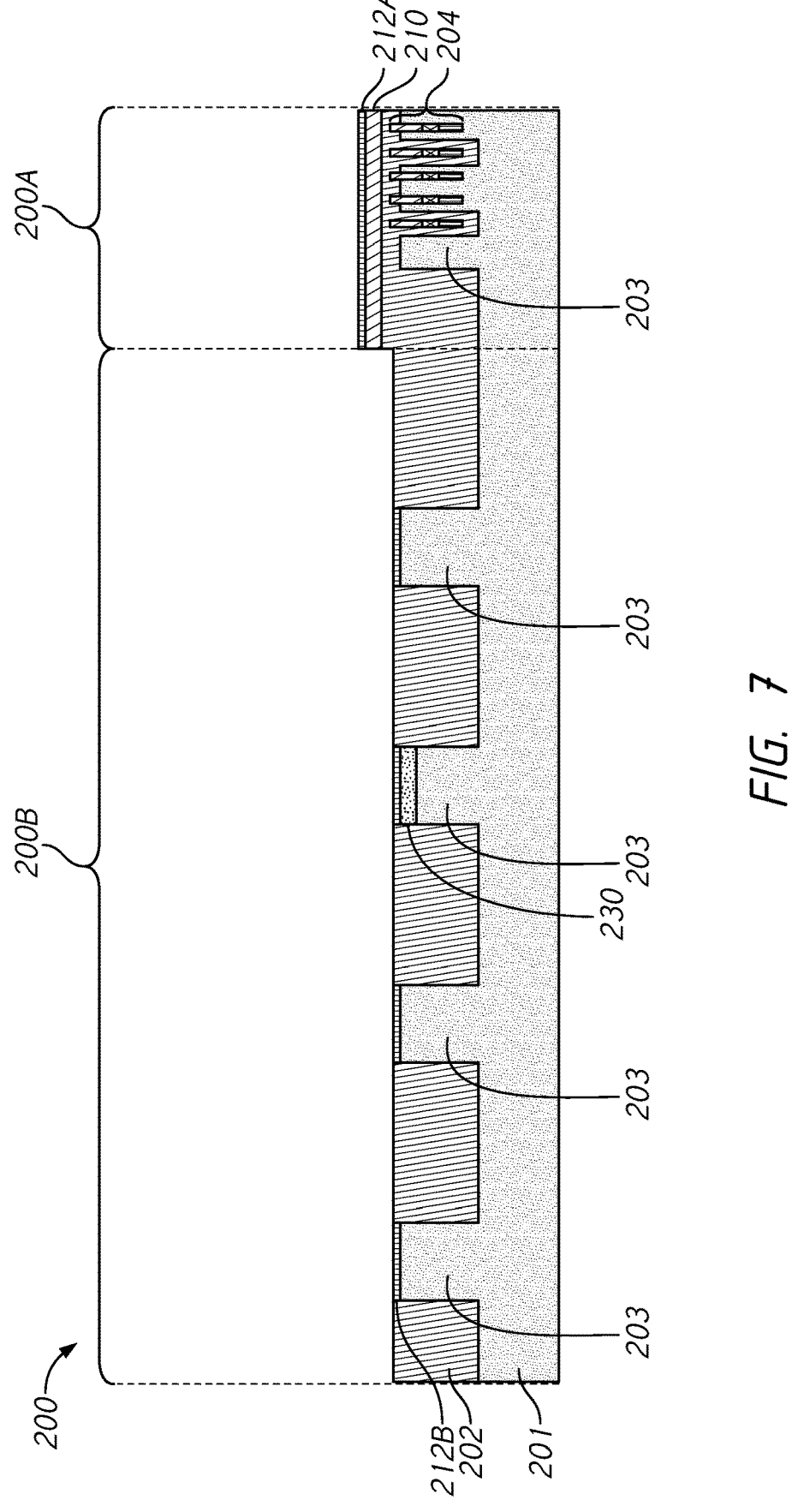
FIG. 7 depicts a process of forming at least part of a memory device including a memory region and a periphery region in a cross-sectional view according to an embodiment of the disclosure.

As shown in FIG. 6, an insulating layer 213, such as an oxide layer or film, is provided on the upper surface of the memory and periphery regions 200A and 200B by, for example, conventional deposition methods. A mask layer 214 is provided on the insulating layer 213 in the memory and periphery regions 200A and 200B. In the example, the mask layer 214 has an opening at a position corresponding to one of the channel regions 203. A photo process, such as conventional photolithography, is then performed to provide, through the opening of the mask layer 214, a channel 230 on the one of the channel regions 203 in the periphery region 200B as shown in FIG. 7. The channel 230 may include, for example, silicon germanium.

Figure 8:
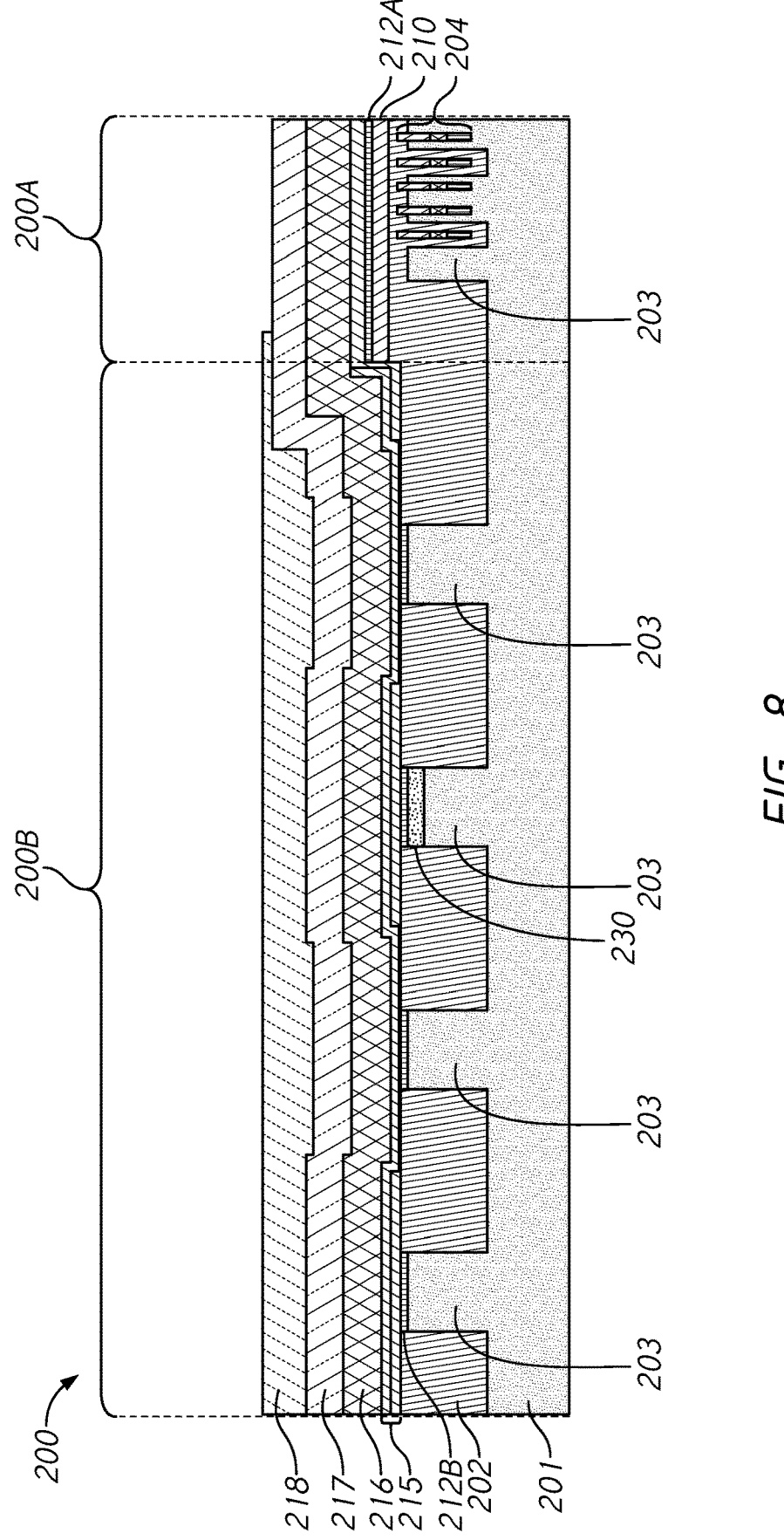
FIG. 8 depicts a process of forming at least part of a memory device including a memory region and a periphery region in a cross-sectional view according to an embodiment of the disclosure.

As shown in FIG. 8, a metal layer 215, a silicon layer 216, an insulating layer 217, and a mask layer 218 are provided on top of each other on the upper surfaces of the periphery region 200B and the memory region 200A by, for example, conventional deposition methods. These layers may form at least part of a gate stack or a gate layer stack over the channel regions 203. The metal layer 215 may include a metal film. The metal layer 215 may include a metal material, such as titanium nitride (TiN). The metal layer 215 may include a plurality of metal layers forming a metal layer stack. The metal layer 215 may be a gate metal layer. The silicon layer 216 may include a silicon film. The silicon layer 216 may include polycrystalline silicon or polysilicon (poly-Si). The silicon layer 216 may be a gate poly-Si layer. The insulating layer 217 may include an insulating film. The insulating layer 217 may be a dielectric layer. The insulating layer 217 may include an insulating material, such as oxide. The insulating layer 217 may provide a gate oxide thin film or gate oxide. The gate oxide may have a high dielectric constant (high-k). The mask layer 218 is for a photo process, such as conventional photolithography. In the memory region 200A, the mask layer 218 or an edge part thereof extending from the periphery region 200B covers only part of the upper surface of the insulating layer 217, the part including the boundary or being in the boundary region between the memory region 200A and the periphery region 200B. Other portions of the upper surface of the insulating layer 217 in the memory region 200A are uncovered by the mask layer 218. The boundary or the boundary region may be one of the boundaries/boundary regions 112 of FIG. 1.

Figure 9:
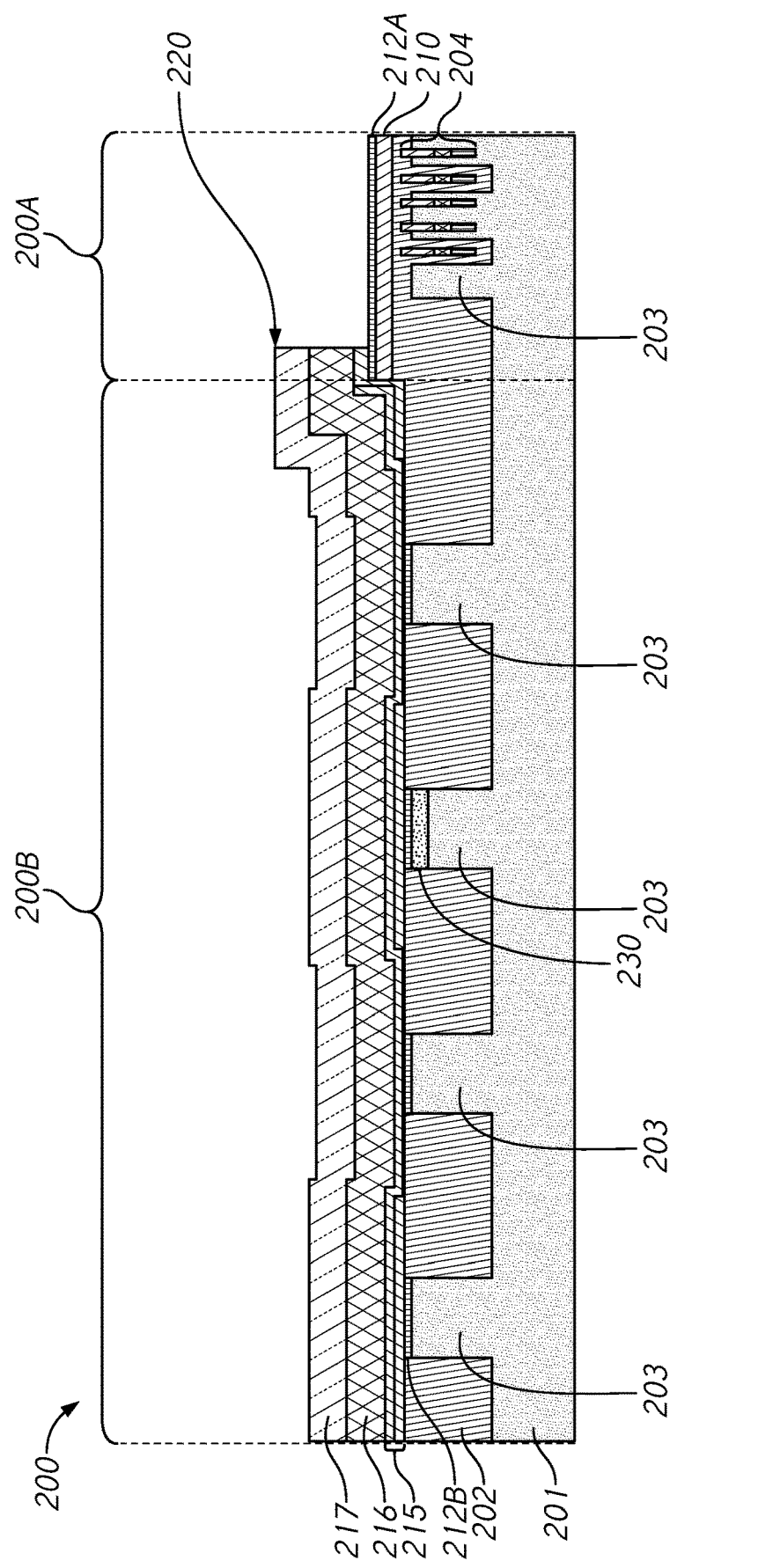
FIG. 9 depicts a process of forming at least part of a memory device including a memory region and a periphery region in a cross-sectional view according to an embodiment of the disclosure.

As shown in FIG. 9, the entirety of the mask layer 218 and the uncovered part of the insulating layer 217 as well as the underlying silicon layer 216 and metal layer 215 in the memory region 200A are removed by photo and etching processes. The photo and etching processes may be performed by conventional photolithography and etching methods. The resultant gate stack remaining in and extending from the periphery region 200B in the horizontal direction (X-direction in the drawing) has an edge part 220 that overlaps in the vertical direction (Z-direction in the drawing) an edge part of the layer stack that includes the insulating layer 210 and the oxidation layer 212A in the memory region 200A. The overlapping edge part 220 also runs in the other horizontal direction (Y-direction in the drawing) in the boundary region between the periphery region 220B and the memoy region 200A.

Because of the overlapping edge part 220 of the gate stack of the periphery region 200B over the underlying edge part of the layer stack of the memory region 200A in the boundary region between the two regions according to the present embodiment, there is no gap or space created between the edge part 220 of the gate stack of the periphery region 200B and the corresponding edge part of the layer stack of the memory region 200A in the boundary region where the two regions face each other. Hence, there is no need for an extra process to fill or close such a gap with another material, such as polysilicon, and make the surface in the boundary region flat prior to the succeeding processes. Furthermore, if such an extra process is performed, the material used to fill or close the gap might cause a defect in a final product; however, the present embodiment can effectively prevent such a defect.

Moreover, because of the overlapping edge or boundary structure of the two regions 200A and 200B according to the present embodiment, the boundary region therebetween can be made smaller or narrower in the horizontal direction (X-direction in the drawing) than the boundary region in the case where there is no overlap, that is there is a gap between the facing edges of the two regions.

Figure 10:
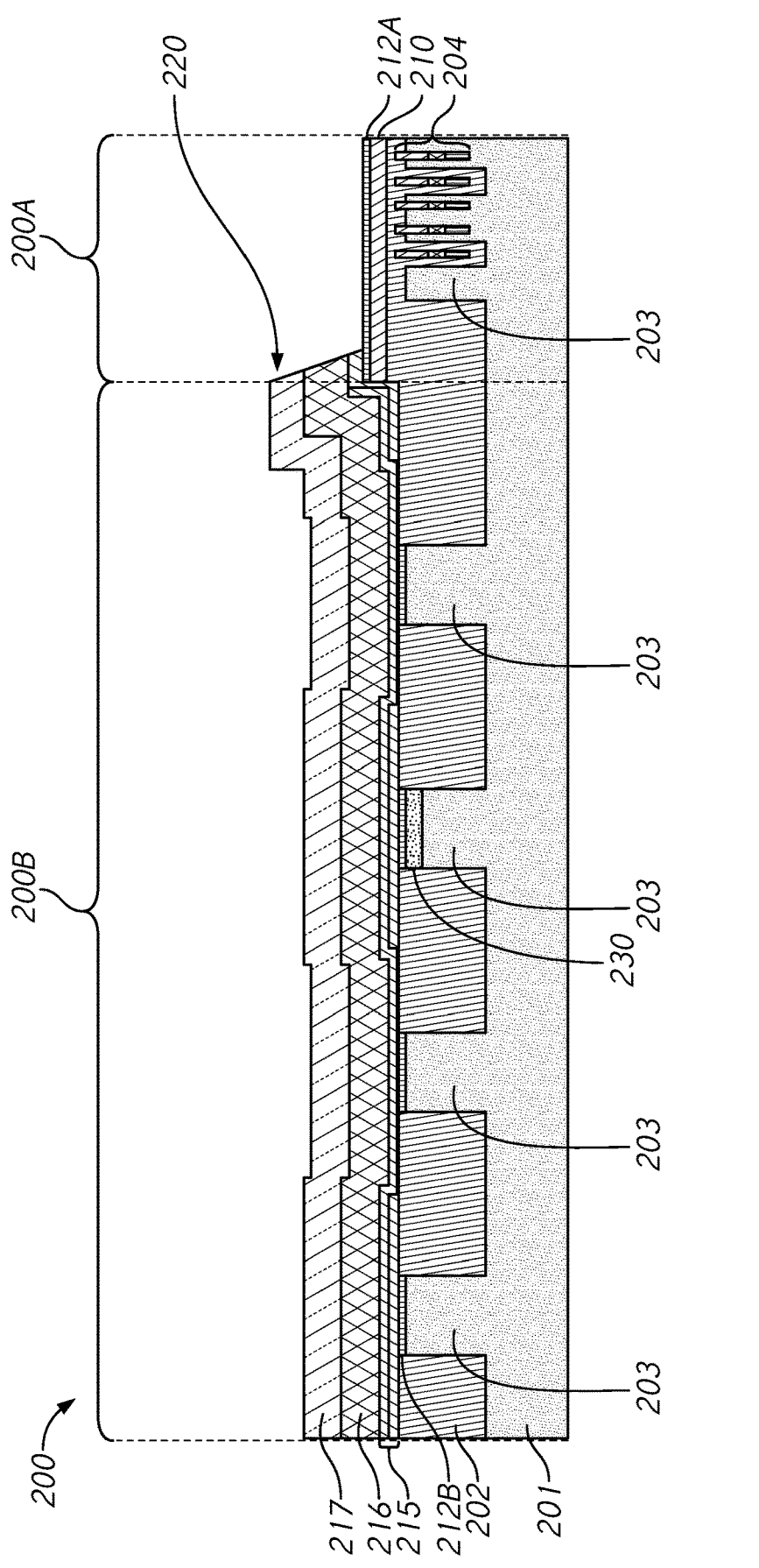
FIG. 10 depicts a process of forming at least part of a memory device including a memory region and a periphery region in a cross-sectional view according to an embodiment of the disclosure.

As shown in FIG. 10, the overlapping edge part 220 in the boundary region may have a side surface (or a side wall) slanted or sloped downwardly toward the upper surface of the insulating layer 212A in the memory region 200A. This slanted or sloped side surface can be formed by adjusting conditions of the etching process, such as the wet etching. For example, a bias voltage may be adjusted to make the slanted side surface of the overlapping edge part 220. A gas flow rate may be adjusted to have a similar effect. Both the bias voltage and the gas flow rate may be adjusted. As one example, the bias voltage may be reduced and the gas flow rate, such as a N$_2$ flow rate, may be increased to etch the side surface of the overlapping edge part 220 to be slanted. This makes the boundary region smoother even with the overlapping structure and further preferable for the succeeding processes, such as a process of creating a bit contact using a polysilicon. As a result, a possible defect in a final product is prevented or mitigated, and the probability of bit failure is reduced, contributing to manufacturing or obtaining nondefective products.

Figure 11:
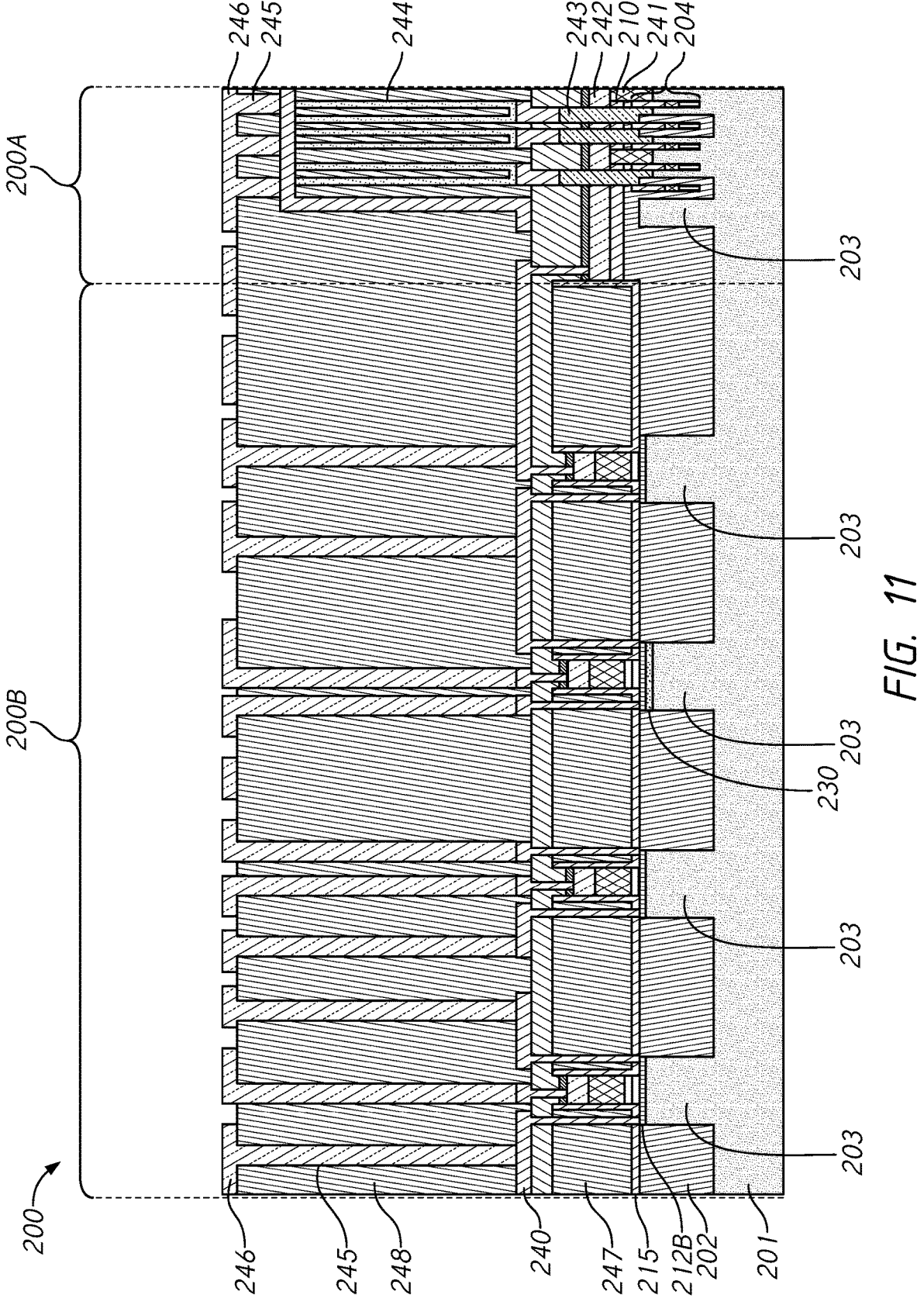
FIG. 11 depicts a process of forming at least part of a memory device including a memory region and a periphery region in a cross-sectional view according to an embodiment of the disclosure.

After the process of FIG. 9 or FIG. 10, the insulating layer 217 is removed by etching, such as wet etching. Subsequently, as shown in FIG. 11, for example, gate elements such as gate wirings 240, bit contacts 241, bit lines (digit lines) 242, storage node contacts 243, storage elements 244, vias 245, pads 246 and the like are provided in the memory region 200A and the periphery region 200B at appropriate positions in, for example, upper layers including but not limited to insulating layers 247 and 248 as part of forming the memory device 200. These elements are formed by conventional methods using conventional materials. The conventional methods include, but are not limited to, gate metal (for example, TiN) deposition, bit/digit line metal (for example, W) deposition, mask (for example, nitride) deposition, photolithography, etching, and the like. The formation or fabrication of the memory device 200 also includes, for example, the backend-of-the line (BEOL). During the subsequent processes, the overlapping edge part 220 in the boundary region as illustrated in FIG. 9 and FIG. 10 is removed to provide a flat underlying surface to facilitate smoother processes.

Referring back to FIG. 9 and FIG. 10, if the gate stack of the periphery region 200B does not include the overlapping edge part 220 in the boundary region with the memory region 200A, there may be a case where a metal material (for example, TiN) of the gate element in the periphery region 200B may react with a metal material (for example, W) of the bit line in the memory region 200A at the boundary region due to the heat of film deposition during the subsequent process of, for example, depositing a mask film (for example, a nitride film) as part of forming the peripheral transistor in the periphery region 200B. This may cause abnormal growth where the reaction has occurred and may lead to deformation of the transistor structure. Such abnormal growth can be, however, avoided by providing the overlapping edge part 220 in the boundary region.

The memory device 100/200 may be, as one example, a dynamic random access memory (DRAM). The examples and the embodiments of the disclosure are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, may also be applicable. Other examples of the semiconductor device, such as logic ICs (a microprocessor, an application-specific integrated circuit (ASIC) or the like), may also be applicable.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. A method of forming a memory device including a memory region and a periphery region, the method comprising:

providing a first insulating layer in the memory region and the periphery region;

removing a first part of the first insulating layer in the periphery region, a second part of the first insulating layer remaining in the memory region;

providing a second insulating layer on the second part of the first insulating layer in the memory region, the second insulating layer and the second part of the first insulating layer forming a layer stack in the memory region; and providing at least part of a gate stack in the periphery region, the gate stack including an overlapping part over the layer stack in the memory region, the overlapping part in a boundary region between the memory region and the periphery region.

2. The method according to claim 1, wherein providing the first insulating layer includes nitride deposition.

3. The method according to claim 2, wherein the first insulating layer includes nitride.

4. The method according to claim 1, wherein removing the first part of the first insulating layer in the periphery region includes removing the first part at the boundary region between the memory region and the periphery region.

5. The method according to claim 1, wherein providing the second insulating layer includes performing oxidation in the memory region to oxidize an upper part of the first insulating layer in the memory region.

6. The method according to claim 5, wherein the first insulating layer includes nitride, and the second insulating layer includes oxidized nitride.

7. The method according to claim 5, wherein the oxidation is performed in the memory region and the periphery region.

8. The method according to claim 1, further comprising providing a mask layer on the gate stack in the periphery region and the layer stack in the memory region, wherein the mask layer covers the periphery region and a part of an upper surface of the layer stack in the memory region, and the part of the upper surface of the layer stack in the memory region covered by the mask layer is in the boundary region.

9. The method according to claim 8, wherein the overlapping part of the gate stack in the boundary region is formed by photo and etching processes.

10. The method according to claim 1, further comprising providing a slanted side surface of the overlapping part in the boundary region.

11. The method according to claim 10, providing the slanted side surface includes adjusting an etching condition including at least one of a bias voltage and a gas flow rate.

12. The method according to claim 1, wherein providing the at least part of the gate stack in the periphery region includes providing a gate metal layer, a gate silicon layer, and a gate insulating layer on top of each other.

13. The method according to claim 1, further comprising:

removing the overlapping part; and providing a gate element in the periphery region and at least one of a bit contact and a bit line in the memory region.

14. A method of forming a memory device including a memory region and a periphery region, the method comprising:

providing a first insulating layer in the memory region and the periphery region;

removing a first part of the first insulating layer in the periphery region, a second part of the first insulating layer remaining in the memory region;

providing a second insulating layer on the second part of the first insulating layer in the memory region, the second insulating layer and the second part of the first insulating layer forming a layer stack in the memory region;

providing at least part of a gate stack in the periphery region; and providing an edge part of the gate stack that overlaps an edge part of the layer stack in a boundary region between the periphery region and the memory region, the overlapping edge part of the gate stack including a slanted side surface.

15. The method according to claim 14, further comprising removing part of an upper part of the periphery region to provide a step structure at the boundary region, wherein providing the at least part of the gate stack includes providing the at least part of the gate stack on the step structure, and providing the overlapping edge part includes providing the overlapping edge part on the step structure.

16. The method according to claim 14, wherein providing the overlapping edge part includes providing a mask layer to cover the boundary region.

17. A method of forming a memory device including a memory region and a periphery region, the method comprising:

depositing a first insulating layer over a semiconductor substrate in the memory region and the periphery region;

removing the first insulating layer in the periphery region and an upper part of the periphery region at a boundary region with the memory region, a part of the first insulating layer remaining in the memory region;

performing oxidation on the remaining part of the first insulating layer in the memory region and on the upper part of the periphery region to provide an oxide layer in the memory region and the periphery region, the oxide layer in the memory region forming a layer stack with the remaining part of the first insulating layer in the memory region; and depositing a plurality of gate layers forming at least part of a gate stack, the at least part of the gate stack including, in the boundary region, an edge part that overlaps an edge part of the layer stack in the memory region.

18. The method according to claim 17, wherein the overlapping edge part includes a slanted side surface.

19. The method according to claim 17, wherein the at least part of the gate stack includes a gate metal layer, a gate silicon layer, and a gate insulating layer on top of each other.

20. The method according to claim 17, wherein the remaining part of the first insulating layer in the memory region includes nitride, and the oxide layer in the memory region includes oxidized nitride.

* * * * *